(12) United States Patent
Kim et al.

(10) Patent No.: US 9,490,788 B2
(45) Date of Patent: Nov. 8, 2016

(54) SEMICONDUCTOR DEVICE

(71) Applicants: SK hynix Inc., Icheon (KR); Korea Advanced Institute of Science and Technology, Daejeon (KR)

(72) Inventors: Yong-Jo Kim, Gwangmyeong (KR); SeongHwan Cho, Daejeon (KR)

(73) Assignees: SK HYNIX INC., Icheon (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 14/856,432

(22) Filed: Sep. 16, 2015

(65) Prior Publication Data

US 2016/0149563 A1 May 26, 2016

(30) Foreign Application Priority Data

Nov. 20, 2014 (KR) ........................ 10-2014-0162976

(51) Int. Cl.
| | |
|---|---|
| H03L 7/06 | (2006.01) |
| H03K 5/135 | (2006.01) |
| H03L 7/081 | (2006.01) |
| H03K 5/00 | (2006.01) |

(52) U.S. Cl.
CPC ............. *H03K 5/135* (2013.01); *H03L 7/0814* (2013.01); *H03K 2005/00019* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 2010/0039157 A1 | 2/2010 | Kaeriyama et al. | |
| 2012/0019299 A1 | 1/2012 | McLeod et al. | |
| 2015/0188527 A1* | 7/2015 | Francom ................... | H03K 5/14 327/158 |
| 2015/0221285 A1* | 8/2015 | Song ..................... | G09G 3/3208 345/210 |
| 2016/0036426 A1* | 2/2016 | Grabinski .............. | H03K 5/135 327/158 |
| 2016/0182061 A1* | 6/2016 | Suetinov .................. | G11C 7/22 365/233.13 |

* cited by examiner

*Primary Examiner* — Adam Houston (57) ABSTRACT

A semiconductor device includes a first variable delay circuit that delays inputted multiphase signals according to a delay control signal, a selection circuit that selects and outputs two signals of signals output from the first variable delay circuit, a second variable delay circuit that delays one of the two signals according to the delay control signal, a phase comparison circuit that compares a phase of a signal outputted by the second variable delay circuit with a phase of the other of the two signals, a filter that updates the delay control signal according to a signal outputted by the phase comparison circuit, and a delay control signal selection circuit that provides the delay control signal to the first variable delay circuit or the second variable delay circuit.

19 Claims, 8 Drawing Sheets

SEMICONDUCTOR DEVICE

The present application claims priority under 35 U.S.C. §119(a) to Korean Application Number 10-2014-0162976, filed on Nov. 20, 2014, in the Korean Intellectual Property Office, which is incorporated herein by reference in its entirety as set forth in full.

BACKGROUND

1. Technical Field

Embodiments of the present disclosure relate to a semiconductor device that removes a phase error in multiphase signals. Particularly, embodiments of the present disclosure relate to a semiconductor device that compares inputted multiphase signals with each other, in order to control a delay amount of each phase signal, thereby removing a phase error in the multiphase signals.

2. Related Art

Figure 1A:
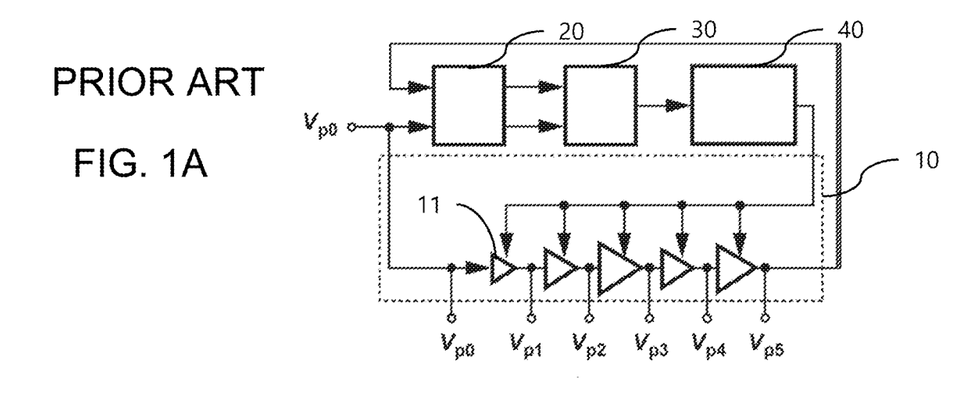
FIG. 1A illustrates a block diagram of a conventional multiphase signal generator.
Figure 1B:
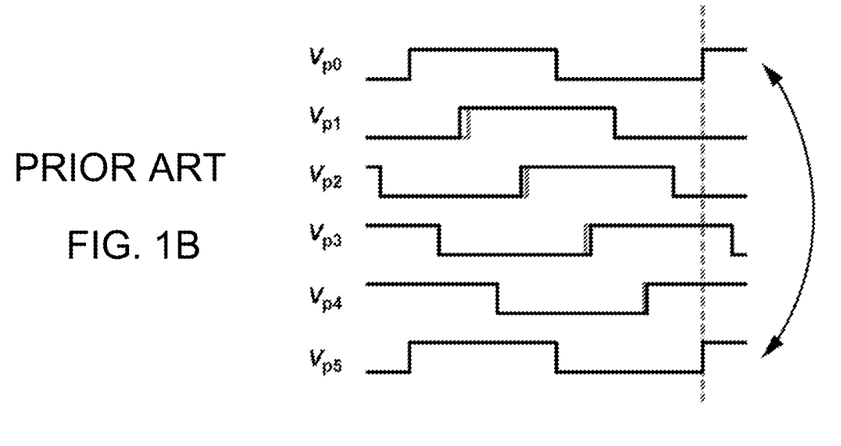
FIG. 1B is a timing diagram illustrating an operation of the multiphase signal generator of FIG. 1A.

FIG. 1A is a block diagram of a conventional multiphase signal generator and FIG. 1B is a timing diagram illustrating an operation of the multiphase signal generator of FIG. 1A.

As illustrated in FIG. 1A, the conventional multiphase signal generator includes a multiphase signal generation circuit 10, a phase comparator 20, a charge pump 30, and a filter 40. The multiphase signal generation circuit 10 includes a plurality of variable delay sections 11 that delay an inputted clock signal Vp0, so that the multiphase signal generation circuit 10 can generate a plurality of multiphase signals, e.g., Vp1 to Vp5. The phase comparator 20 compares phases of the multiphase signal Vp5 outputted by the multiphase signal generation circuit 10 with the inputted clock signal Vp0. The charge pump 30 adjusts a level of an output voltage in response to a comparison result of the phase comparator 20. The filter 40 controls a delay amount of the multiphase signal generation circuit 10 according to the output voltage of the charge pump 30.

In FIG. 1A, among the inputted clock signal Vp0 and multiphase signals Vp1 to Vp4 output from the plurality of variable delay sections 11 of the multiphase signal generation circuit 10, two signals having neighboring phases preferably have a phase difference obtained by dividing one cycle of the inputted clock signal Vp0 into five equal parts. However, as illustrated in FIG. 1B, in the conventional multiphase signal generator, the inputted clock signal Vp0 and the outputted multiphase signal Vp5 are compared with each other, and the filter 40 stops controlling the delay amount of the multiphase signal generation circuit 10 when phases of the two signals Vp0 and Vp5 have no phase difference.

Accordingly, when a delay amount of each delay section 11 in the multiphase signal generation circuit 10 changes by a factor such as process variation, a phase difference between two signals having neighboring phases may not be equivalent to that of another two signals having neighboring phases. That is, a phase difference between two signals having neighboring phases, among the signals Vp0 to Vp4, may be different from a phase difference obtained by dividing one cycle of the inputted clock signal Vp0 into five equal parts.

SUMMARY

Embodiments of the present disclosure are directed to a technology that compares inputted multiphase signals with each other and adjusts a delay amount of each signal according to a comparison result, thereby removing a phase error in the multiphase signals.

In one embodiment of the present invention, a semiconductor device includes a first variable delay circuit that delays inputted multiphase signals according to a delay control signal; a selection circuit that selects two signals of signals output from the first variable delay circuit; a second variable delay circuit that delays one of the two signals according to the delay control signal; a phase comparison circuit that compares a phase of a signal outputted by the second variable delay circuit to a phase of the other of the two signals; a filter that updates the delay control signal according to a signal outputted by the phase comparison circuit; and a delay control signal selection circuit that provides the delay control signal to the first variable delay circuit or the second variable delay circuit.

BRIEF DESCRIPTION OF THE DRAWINGS

Features, aspects, and embodiments are described in conjunction with the attached drawings, in which.

DETAILED DESCRIPTION

Hereinafter, a semiconductor device according to embodiments of the present disclosure will be described in detail with reference to the accompanying drawings.

Hereinafter, a quadrature signal will be described as an example of a multiphase signal of the present invention. Furthermore, input signals, before a phase error therein is corrected, will be referred to as a first input signal Ii, a second input signal Qi, a third input signal IBi, and a fourth input signal QBi; and error-corrected signals will be referred to as a first signal I, a second signal Q, a third signal IB, and a fourth signal QB in a phase order.

Figure 2:
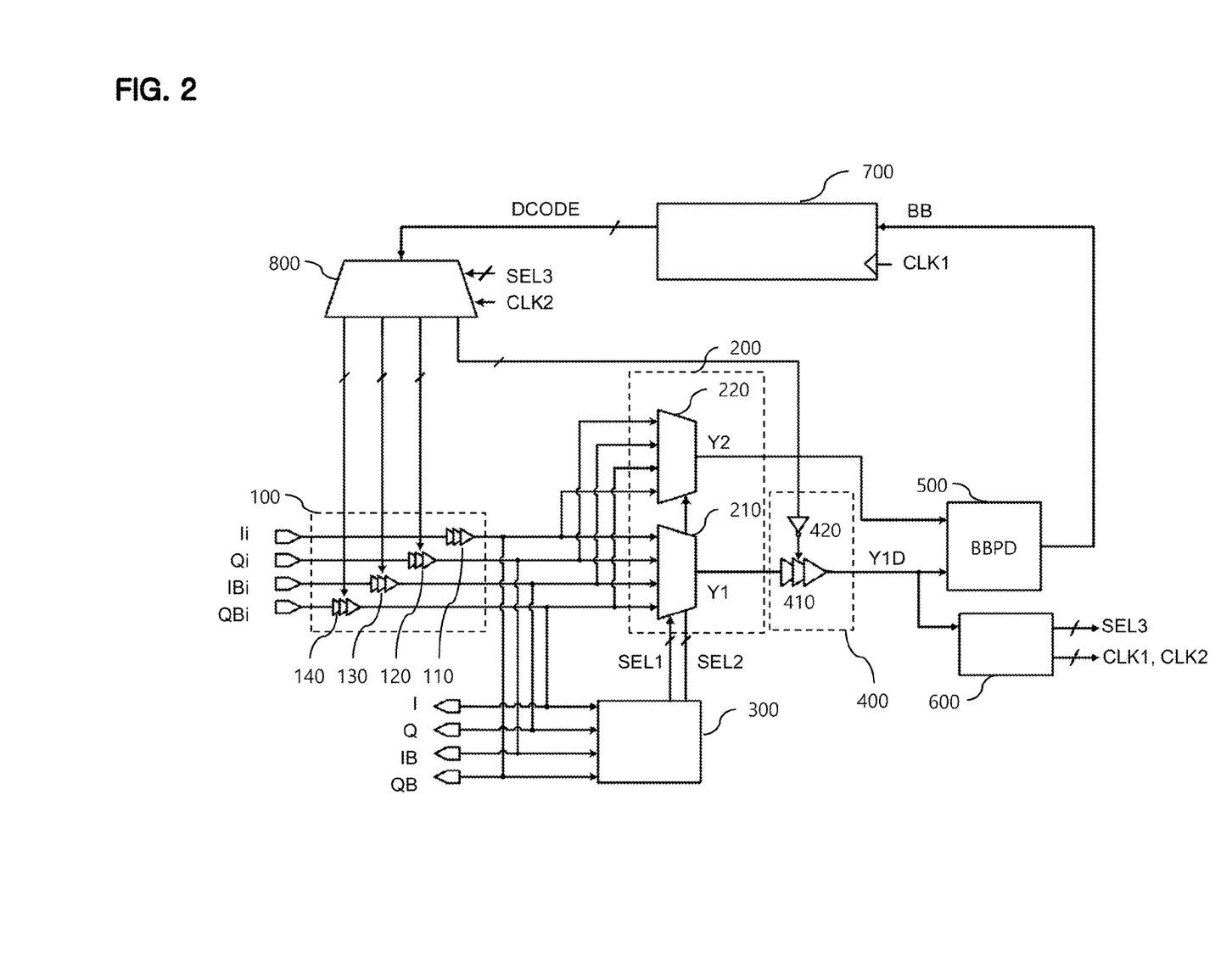
FIG. 2 is a block diagram of a semiconductor device according to an embodiment of the present disclosure.

FIG. 2 is a block diagram of a semiconductor device according to an embodiment of the present disclosure.

The semiconductor device according to the embodiment includes a first variable delay circuit 100, a selection circuit 200, a first control circuit 300, a second variable delay circuit 400, a phase comparison circuit 500, a second control circuit 600, a filter 700, and a delay control signal selection circuit 800.

The first variable delay circuit 100 includes an eleventh delay section 110 that delays the first input signal Ii and outputs the first signal I, a twelfth delay section 120 that variably delays the second input signal Qi according to a delay control signal DCODE and outputs the second signal Q, a thirteenth delay section 130 that variably delays the third input signal IBi according to the delay control signal DCODE and outputs the third signal IB, and a fourteenth delay section 140 that variably delays the fourth input signal QBi according to the delay control signal DCODE and outputs the fourth signal QB.

The selection circuit 200 includes a first selection section 210 and a second selection section 220.

The first selection section 210 selects and outputs any one of the first signal I to the fourth signal QB in response to a first selection signal SEL1. The second selection section 220 selects and outputs any one of the first signal I to the fourth signal QB in response to a second selection signal SEL2.

The first control circuit 300 generates the first selection signal SEL1 and the second selection signal SEL2 with reference to the first signal I to the fourth signal QB.

The first selection signal SEL1 and the second selection signal SEL2 are generated such that a signal selected by the first selection section 210 and a signal selected by the second selection section 220 have neighboring phases. A pair of signals among a group has "neighboring phases" when one of the signals is directly subsequent to the other signal, such that no other signal in the group occurs between the pair of signals having neighboring phases.

For example, when the first signal I is selected by the first selection section 210, the second signal Q is selected by the second selection section 220, and when the fourth signal QB is selected by the first selection section 210, the first signal I is selected by the second selection section 220.

The first selection signal SEL1, the second selection signal SEL2, and the selection circuit 200 will be described in detail with reference to FIG. 2 and FIG. 3.

The second variable delay circuit 400 includes a twenty-first delay section 410 that outputs a signal Y1D obtained by variably delaying a signal Y1 outputted by the first selection section 210.

Hereinafter, a reference delay amount ΔT indicates a delay amount of the twenty-first delay section 410. The reference delay amount ΔT serves as a reference for adjusting a phase difference between two neighboring signals among the first signal I to the fourth signal QB. For example, when a cycle of the first signal I to the fourth signal QB is 800 ps, the reference delay amount ΔT is controlled to be 200 ps.

In the present embodiment, the reference delay amount ΔT is adjusted to be a finally desired value after a delay amount of each delay section of the first variable delay circuit 100 is determined.

That is, after the delay amounts of the twelfth delay section 120, the thirteenth delay section 130, and the fourteenth delay section 140 are adjusted such that a phase difference between two signals having neighboring phases is equal to the reference delay amount ΔT, the reference delay amount ΔT is adjusted to have a value corresponding to a phase difference of 90°.

As a consequence, two signals having neighboring phases, among the first signal I to the fourth signal QB, are adjusted to have a phase difference of 90° therebetween.

The second variable delay circuit 400 may further include an inversion section 420 that inverts a sign of the delay control signal DCODE outputted by the filter 700. The inversion section 420 inverts the sign by inverting each bit of the delay control signal DCODE using a 2's complement operation.

An output signal of the inversion section 420 controls the delay amount of the twenty-first delay section 410. This operation will be described in detail with reference to FIG. 5 and FIG. 7.

The phase comparison circuit 500 compares a phase of the output signal Y1D of the second variable delay circuit 400 with a phase of an output signal Y2 of the second selection section 220.

In an embodiment, the phase comparison circuit 500 is implemented using a bang-bang phase detector. Therefore, when the phase of the output signal Y2 of the second selection section 220 is ahead of the phase of the output signal Y1D of the second variable delay circuit 400, the phase comparison circuit 500 outputs a phase comparison signal BB having a logic value '1.' Otherwise, the phase comparison circuit 500 outputs the phase comparison signal BB having a logic value '0.' The phase comparison signal BB is provided to the filter 700.

The second control circuit 600 generates a third selection signal SEL3, a first clock signal CLK1, and a second clock signal CLK2 based on the output signal Y1D of the second variable delay circuit 400. The first clock signal CLK1 is used to synchronize the filter 700, and the second clock signal CLK2 is used to synchronize the delay control signal selection circuit 800. The third selection signal SEL3 is used by the delay control signal selection circuit 800 when the delay control signal selection circuit 800 selects an output direction of the delay control signal DCODE.

The filter 700 updates the delay control signal DCODE according to the phase comparison signal BB output from the phase comparison circuit 500. The delay control signal DCODE may be a multi-bit digital signal. In an embodiment, the delay control signal DCODE is a 6-bit digital signal having a sign expressed by a 2's complement.

In the present embodiment, when the phase comparison signal BB has a logic value '1,' the filter 700 may increase a value of the delay control signal DCODE by 1, and when the phase comparison signal BB has a logic value '0,' the filter 700 may decrease the value of the delay control signal DCODE by 1. The size of the increased or decreased value may change according to embodiments.

The delay control signal selection circuit 800 provides the delay control signal DCODE outputted by the filter 700 to the first variable delay circuit 100 or the second variable delay circuit 400 in response to the third selection signal SEL3. The output of the delay control signal selection circuit 800 may be synchronized with the second clock signal CLK2.

Figure 3:
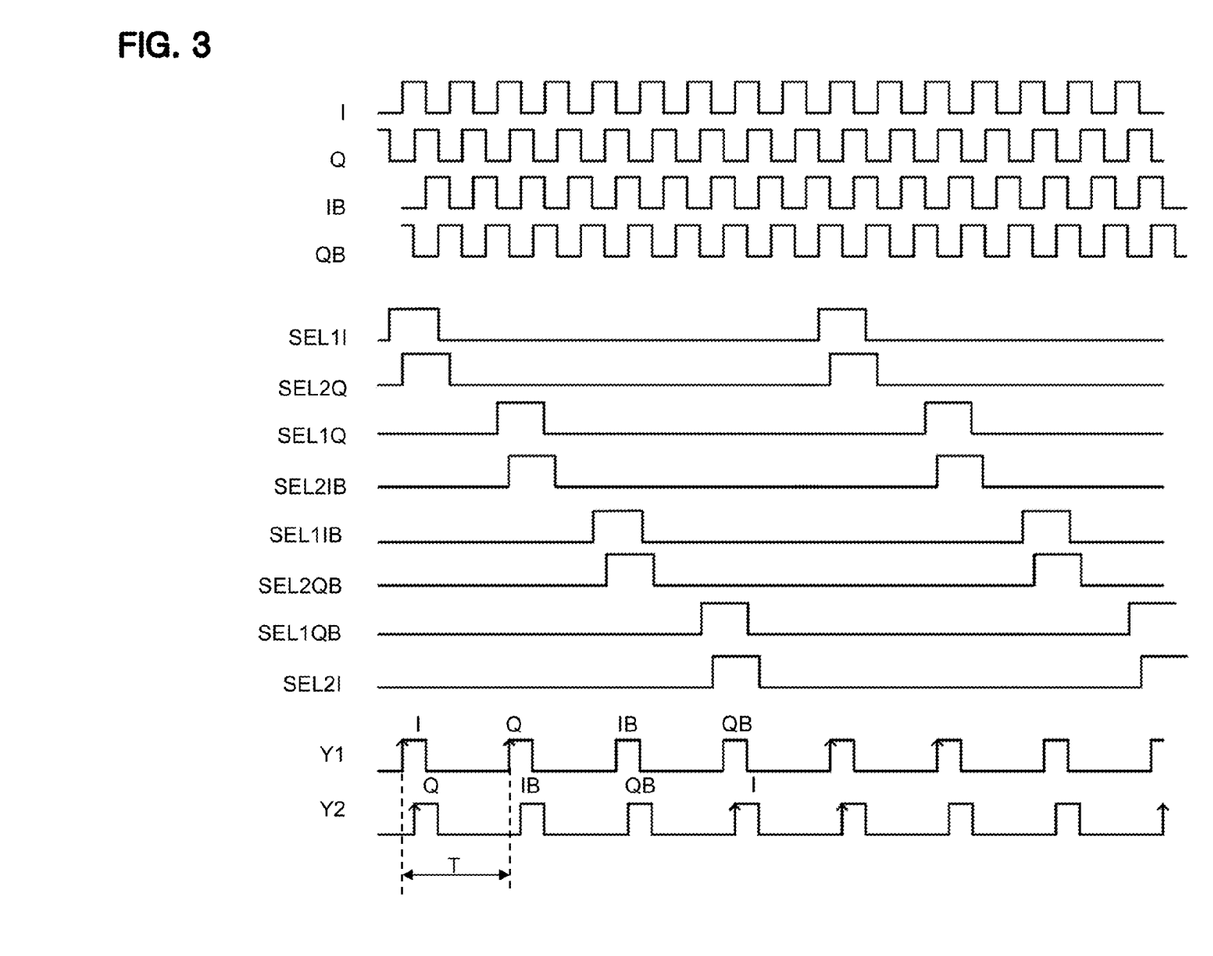
FIG. 3 is a timing diagram illustrating operations of a first control circuit and a selection circuit of FIG. 2 according to an embodiment of the present disclosure.

FIG. 3 is a timing diagram illustrating operations of the first control circuit 300 and the selection circuit 200 of FIG. 2.

The timing diagram of FIG. 3 illustrates an operation in which the first selection section 210 and the second selection section 220 select and output two signals having neighboring phases.

The first selection signal SEL1 includes an eleventh selection signal SEL1I for deciding whether to output the first signal I, a twelfth selection signal SEL1Q for deciding whether to output the second signal Q, a thirteenth selection signal SEL1IB for deciding whether to output the third signal IB, and a fourteenth selection signal SEL1QB for deciding whether to output the fourth signal QB.

The second selection signal SEL2 includes a twenty-first selection signal SEL2I for deciding whether to output the first signal I, a twenty-second selection signal SEL2Q for deciding whether to output the second signal Q, a twenty-third selection signal SEL2IB for deciding whether to output the third signal IB, and a twenty-fourth selection signal SEL2QB for deciding whether to output the fourth signal QB.

The first selection signal SEL1 and the second selection signal SEL2 are activated such that any two signals having neighboring phases are respectively selected by the first selection section 210 and the second selection section 220.

As illustrated in FIG. 3, the first selection signal SEL1 and the second selection signal SEL2 are generated such that the first signal I and the second signal Q, the second signal Q and the third signal IB, the third signal IB and the fourth signal QB, or the fourth signal QB and the first signal I are respectively outputted through the first selection section 210 and the second selection section 220.

In the present embodiment, a time T, required to change the output signal Y1 of the first selection section 210 and the output signal Y2 of the second selection section 220, is set to a time required until a signal generated in the filter 700 via the second variable delay circuit 400 and the phase comparison circuit 500, by the signals Y1 and Y2 previously outputted by the selection circuit 200, is provided to the first variable delay circuit 100 via the delay control signal selection circuit 800; thus, delay amounts of the first signal I to the fourth signal QB are adjusted. That is, the time T is determined by a sum of operational times of the second variable delay circuit 400, the phase comparison circuit 500, the filter 700, the delay control signal selection circuit 800, and the first variable delay circuit 100.

Figure 4:
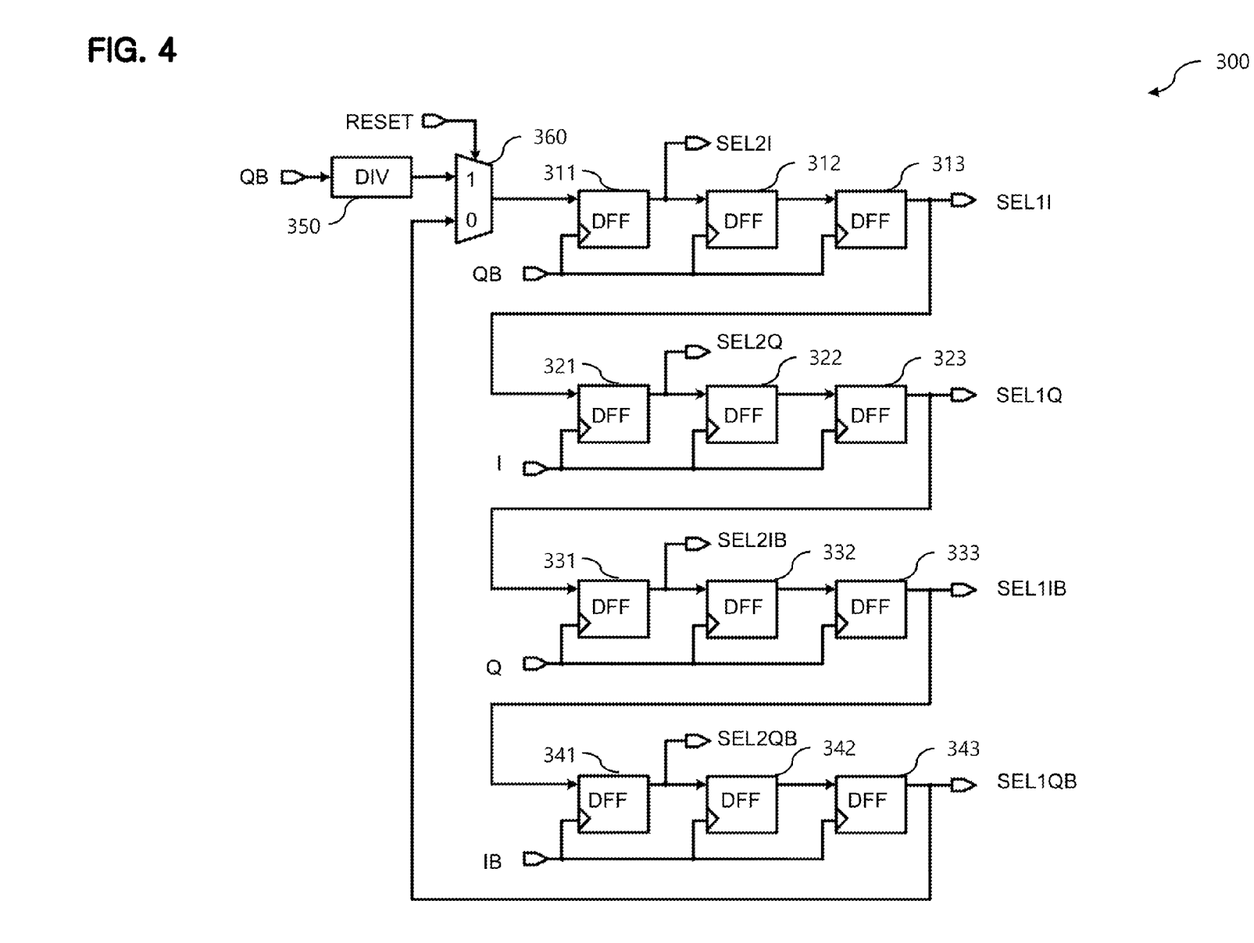
FIG. 4 is a circuit diagram illustrating the first control circuit of FIG. 2 according to an embodiment of the present disclosure.

FIG. 4 is a circuit diagram illustrating the first control circuit 300 according to an embodiment.

The first control circuit 300 allows the first selection signal SEL1 and the second selection signal SEL2 to be outputted at the timings illustrated in FIG. 3.

The first control circuit 300 includes a division section 350 that divides the fourth signal QB, and a third selection section 360 that selects an output signal of the division section 350 or the fourteenth selection signal SEL1QB in response to a reset signal RESET.

In the present embodiment, the division section 350 divides 9 cycles of the inputted fourth signal QB into two parts and outputs a signal having a high level during one cycle and having a low level during the other 8 cycles from a point of time when the fourth signal QB is initially activated among the 9 cycles.

An output signal of the third selection section 360 sequentially passes through a plurality of D flip-flops 311 to 313, 321 to 323, 331 to 333, and 341 to 343, and is fed back to the third selection section 360.

When the reset signal RESET has been activated, the third selection section 360 selects the output signal of the division section 350. When the reset signal RESET has not been activated, the third selection section 360 selects a signal fed back from the D flip-flop 343.

The D flip-flops 311 to 313, 321 to 323, 331 to 333, and 341 to 343 are used to adjust output timings of the first selection signal SEL1 and the second selection signal SEL2.

For example, the eleventh selection signal SEL1I and the twenty-second selection signal SEL2Q are activated at neighboring positions as illustrated in FIG. 3 such that the first signal I and the second signal Q having neighboring phases may be selected and respectively outputted as the output signals Y1 and Y2 of the selection circuit 200.

In the present embodiment, the eleventh selection signal SEL1I is generated such that its activation period is concurrent with a period in which the first signal I is activated. To this end, the eleventh selection signal SEL1I is generated by latching the output signal of the division section 350 that is generated from the fourth signal QB, in synchronization with the fourth signal QB.

Accordingly, the eleventh selection signal SEL1I has a window waveform which is concurrent with an activated state during one cycle of the fourth signal QB starting from a rising edge of the fourth signal QB, as illustrated in FIG. 3. Since a phase of the fourth signal QB is ahead of a phase of the first signal I by 90°, the activation period of the eleventh selection signal SEL1I becomes long enough to occur concurrently with an activated part of the first signal I.

Similarly, the twenty-second selection signal SEL2Q is generated by latching the eleventh selection signal SEL1I at a rising edge of the first signal I. Since the eleventh selection signal SEL1I is still in the activated state during the rising edge of the first signal I, the twenty-second selection signal SEL2Q has a window waveform which is concurrent with an activated state during one cycle starting from the rising edge of the first signal I. Since the phase of the first signal I is ahead of a phase of the second signal Q by 90°, an activation period of the twenty-second selection signal SEL2Q becomes long enough to occur concurrently with an activated part of the second signal Q.

Since operations for generating the other first selection signals SEL1Q, SEL1IB, and SEL1QB and second selection signals SEL2IB, SEL2QB, and SEL2I are substantially the same as described above, a description thereof will be omitted.

Figure 5:
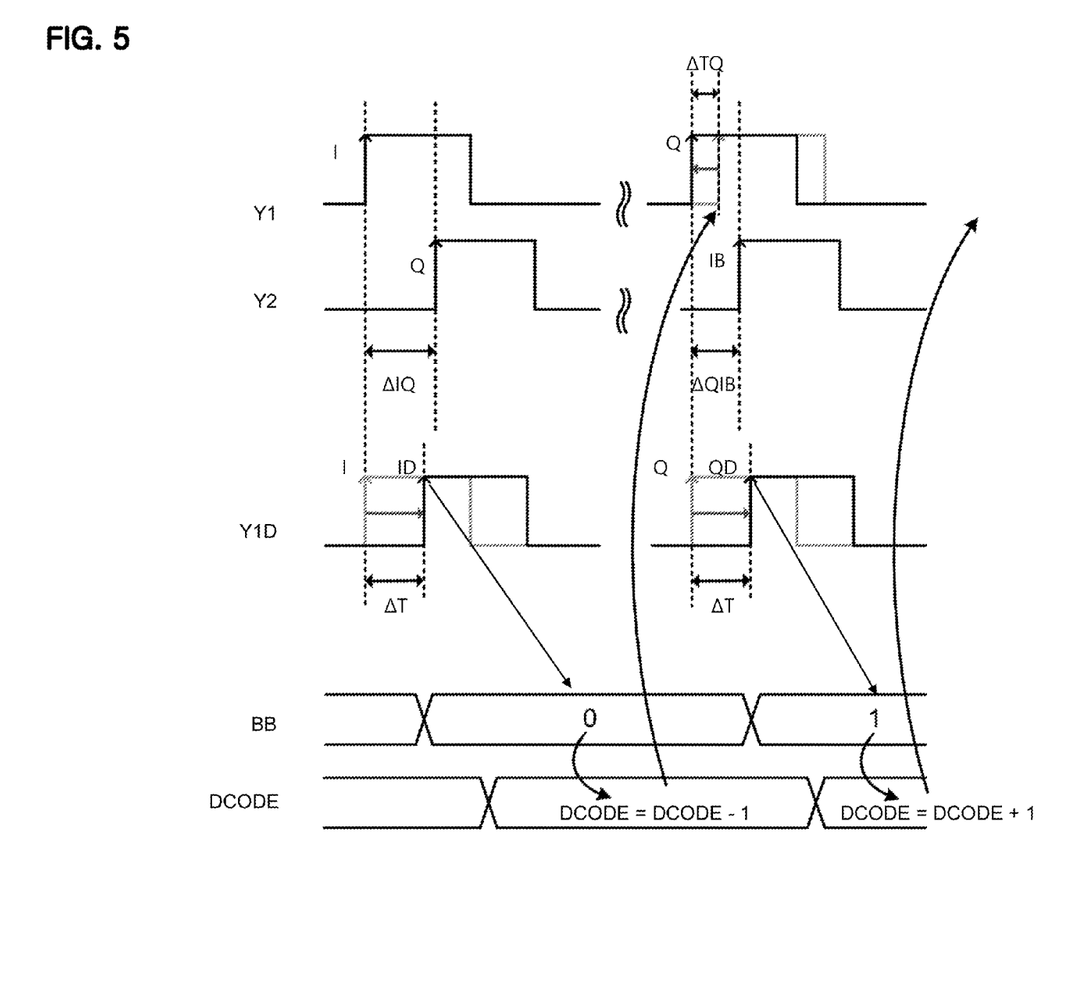
FIG. 5 is a timing diagram illustrating an operation of a semiconductor device according to an embodiment of the present disclosure.

FIG. 5 is a timing diagram illustrating an operation of the semiconductor device according to an embodiment of the present disclosure.

The timing diagram of FIG. 5 is based on the assumption that the output signal Y1 of the first selection section 210 is the first signal I and the output signal Y2 of the second selection section 220 is the second signal Q.

The output signal Y1 of the first selection section 210 is delayed by the second variable delay circuit 400 and then is outputted as the output signal Y1D.

As described above, the delay amount of the second variable delay circuit 400 corresponds to the reference delay amount ΔT for adjusting a phase difference between two signals having neighboring phases.

The phase comparison circuit 500 compares the phase of the output signal Y1D of the second variable delay circuit 400 with the phase of the output signal Y2 of the second selection section 220.

When the phase of the signal Y2 outputted by the second selection section 220 is ahead of the phase of the signal Y1D outputted by the second variable delay circuit 400, the phase comparison circuit 500 outputs the phase comparison signal BB having a logic value '1.' Otherwise, the phase comparison circuit 500 outputs the phase comparison signal BB having a logic value '0.'

The phase comparison signal BB is provided to the filter 700 and used to update a value of the delay control signal DCODE. In the present embodiment, when the logic value of the phase comparison signal BB is 1, the value of the delay control signal DCODE is increased by 1, and when the logic value of the phase comparison signal BB is 0, the value of the delay control signal DCODE is decreased by 1.

The updated delay control signal DCODE is used to adjust the delay amount of the twelfth delay section 120.

Such a feedback control operation is repeated, so that a phase difference between two signals having neighboring phases is adjusted to a value corresponding to the delay amount of the second variable delay circuit 400, i.e., by the reference delay amount ΔT.

In the present embodiment, when a comparison operation for the first signal I and the second signal Q is performed, a delay amount of the second input signal Qi is adjusted by the twelfth delay section 120, and thus the second signal Q is updated. Then, a comparison operation for the updated second signal Q and the third signal IB is performed as described at a right side of FIG. 5.

FIG. 5 illustrates, at its right side, a process in which the comparison operation for the updated second signal Q and the third signal IB is performed. Since the comparison operation is substantially the same as described above, a description thereof will be omitted.

Figure 6:
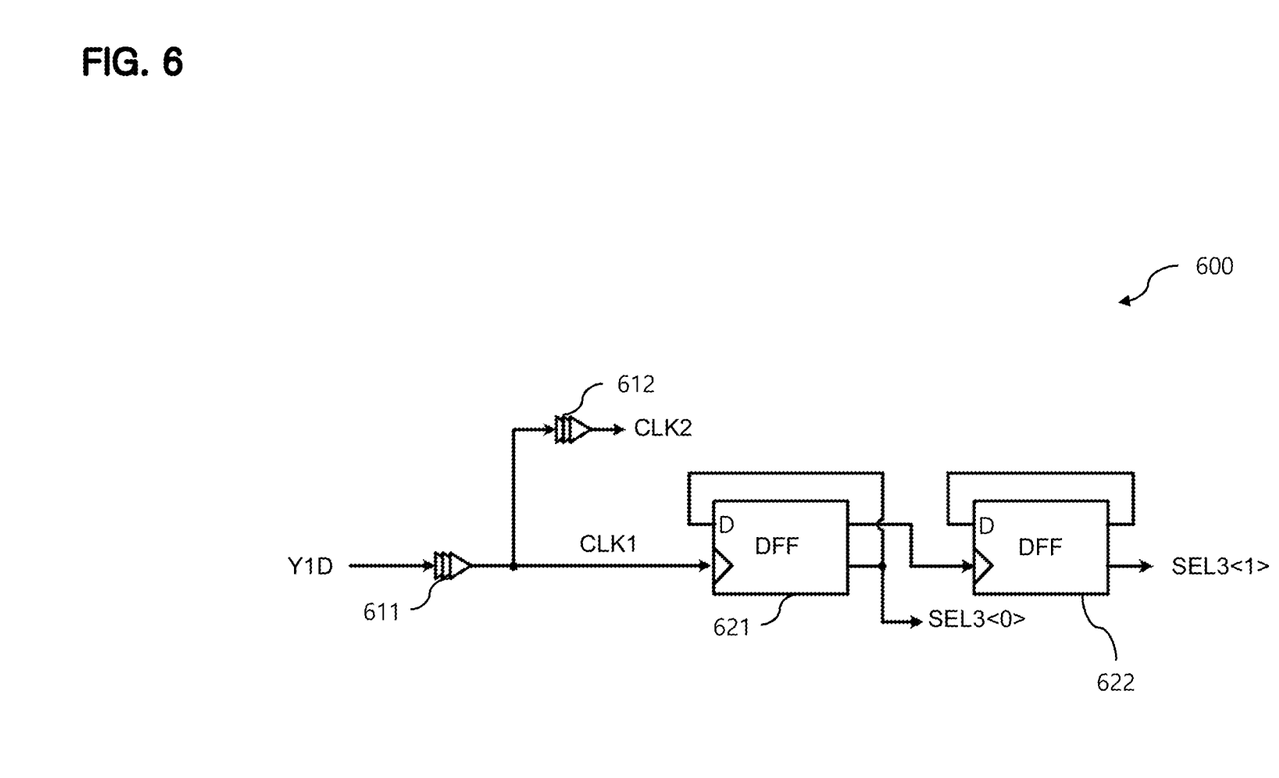
FIG. 6 is a circuit diagram illustrating a second control circuit of FIG. 2 according to an embodiment of the present disclosure.

FIG. 6 is a circuit diagram illustrating the second control circuit 600 of FIG. 2 according to an embodiment.

The second control circuit 600 includes a sixty-first delay section 611 that delays the output signal of the second variable delay circuit 400 by a first time and outputs a first clock signal CLK1, and a sixty-second delay section 612 that delays the first clock signal CLK1 by a second time and outputs a second clock signal CLK2.

The first time corresponds to a time required to perform the operation of the phase comparison circuit 500, and the second time corresponds to a time required to update the delay control signal DCODE in the filter 700.

The second control circuit 600 further includes D flip-flops 621 and 622 that output the 2-bit third selection signal SEL3 in sequence of '00,' '01,' '10,' and '11' in synchronization with the first clock signal CLK1.

The third selection signal SEL3 allows the delay control signal DCODE outputted by the filter 700 to be sequentially provided to the twelfth delay section 120, the thirteenth delay section 130, the fourteenth delay section 140, and the second variable delay circuit 400.

Figure 7:
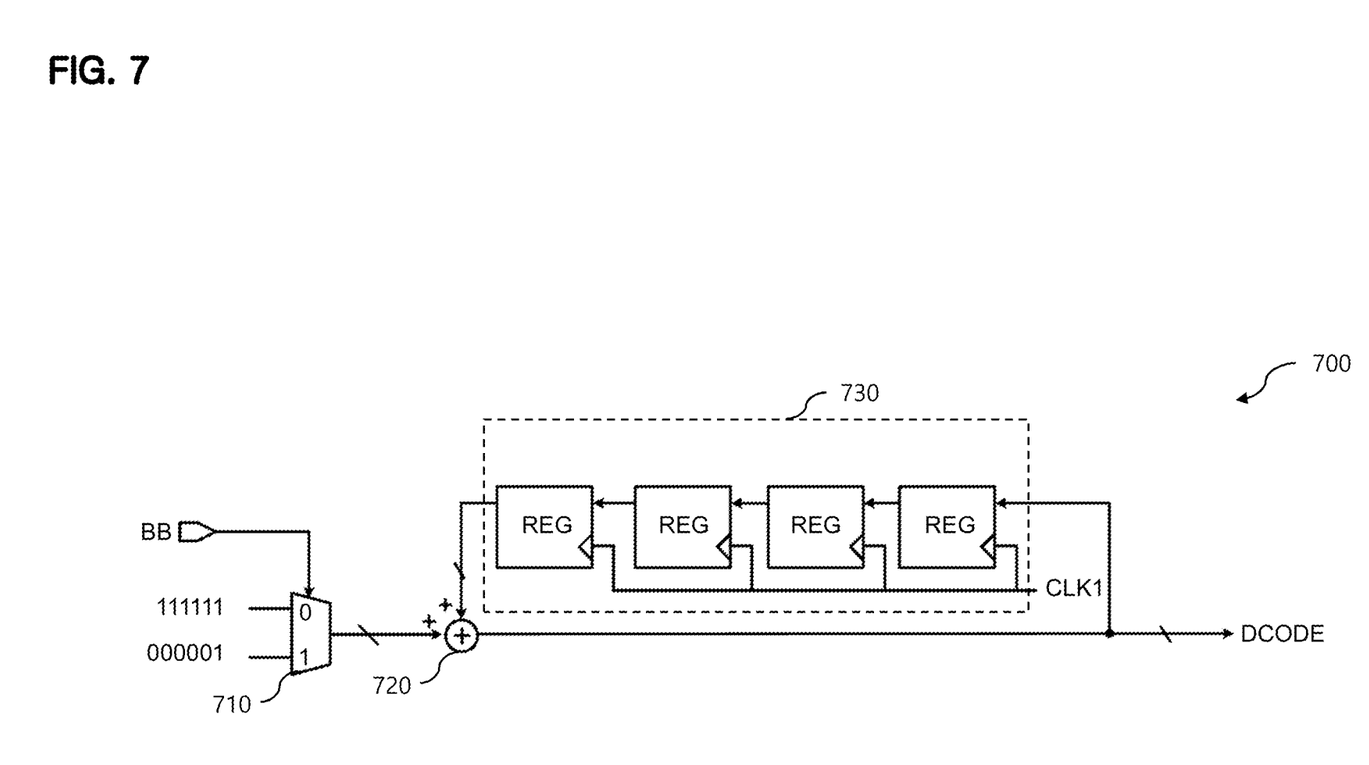
FIG. 7 is a circuit diagram illustrating a filter of FIG. 2 according to an embodiment of the present disclosure.

FIG. 7 is a circuit diagram illustrating the filter 700 of FIG. 2 according to an embodiment.

The filter 700 includes a fourth selection section 710, an operation section 720, and a register section 730.

The fourth selection section 710 outputs '111111' or '000001' in response to the phase comparison signal BB of the phase comparison circuit 500. These signals are output as 6-bit signals having a sign expressed by a 2's complement, wherein '000001' is a 6-bit value corresponding to 1, and '111111' is a 6-bit value corresponding to −1.

The operation section 720 adds the value of the output signal of the fourth selection section 710 to a value of the 6-bit delay control signal DCODE previously stored in the register section 730, thereby outputting an updated delay control signal DCODE.

That is, when the phase comparison signal BB of the phase comparison circuit 500 has a logic value '0,' the fourth selection section 710 selects '111111,' and thus the delay control signal DCODE is updated to have a value decreased by 1, and when the phase comparison signal BB of the phase comparison circuit 500 has a logic value '1,' the fourth selection section 710 selects '000001,' and thus the delay control signal DCODE is updated to have a value increased by 1.

As the value of the delay control signal DCODE is updated, the delay amounts of the first variable delay circuit 100 and the second variable delay circuit 400 are increased or decreased.

Since the register section 730 shifts and outputs the delay control signal DCODE in synchronization with the first clock signal CLK1 generated based on the signal Y1D output from the second variable delay circuit 400, the delay control signals DCODE for the twelfth delay section 120, the thirteenth delay section 130, the fourteenth delay section 140, and the second variable delay unit 400 may be updated without being mixed.

In an embodiment, the register section 730 separately stores a delay control signal DCODE to be provided to the first variable delay circuit 100 and a second delay control signal DCODE to be provided to the second variable delay circuit 400.

Figure 8:
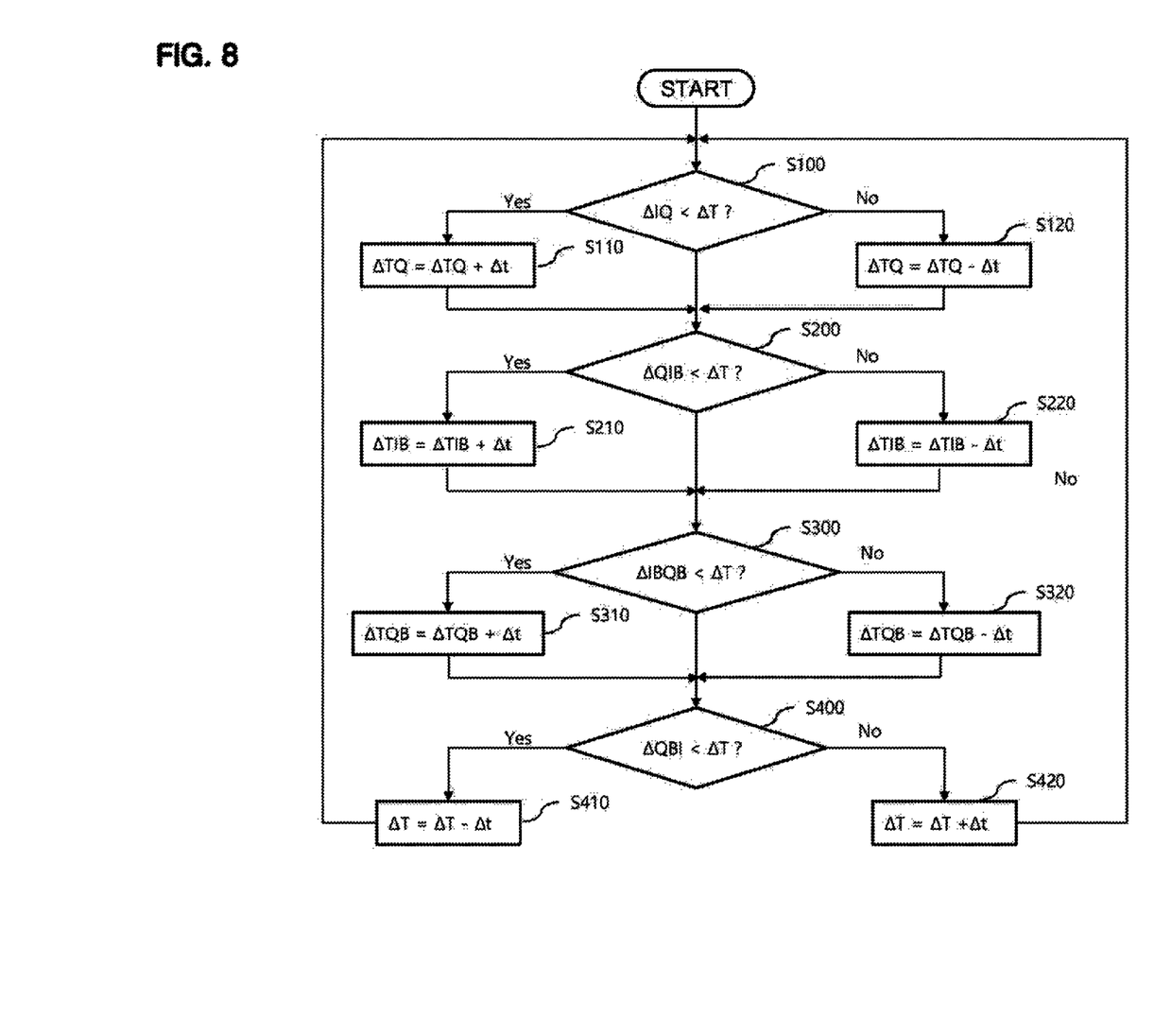
FIG. 8 is a flowchart illustrating an operation of the semiconductor device of FIG. 2 according to an embodiment.

FIG. 8 is a flowchart illustrating an operation of the semiconductor device of FIG. 2 according to an embodiment.

A phase difference ΔIQ between the first signal I and the second signal Q is compared with the reference delay amount ΔT, that is, the delay amount of the second variable delay circuit 400 at S100.

As a result of the comparison, if the reference delay amount ΔT is longer than the phase difference ΔIQ, a delay amount ΔTQ of the second signal Q is increased by a predetermined amount Δt at S110, and if the reference delay amount ΔT is not longer than the phase difference ΔIQ, the delay amount ΔTQ of the second signal Q is decreased by the predetermined amount Δt at S120.

Next, a phase difference ΔQIB between the second signal Q and the third signal IB is compared with the reference delay amount ΔT at S200.

As a result of the comparison, if the reference delay amount ΔT is longer than the phase difference ΔQIB, a delay amount ΔTIB of the third signal IB is increased by the predetermined amount Δt at S210, and if the reference delay amount ΔT is not longer than the phase difference ΔQIB, the delay amount ΔTIB of the third signal IB is decreased by the predetermined amount Δt at S220.

Then, a phase difference ΔIBQB between the third signal IB and the fourth signal QB is compared with the reference delay amount ΔT at S300.

As a result of the comparison, if the reference delay amount ΔT is longer than the phase difference ΔIBQB, a delay amount ΔTQB of the fourth signal QB is increased by the predetermined amount Δt at S310, and if the reference delay amount ΔT is not longer than the phase difference ΔIBQB, the delay amount ΔTQB of the fourth signal QB is decreased by the predetermined amount Δt at S320.

Finally, a phase difference ΔQBI between the fourth signal QB and the first signal I is compared with the reference delay amount ΔT at S400.

As a result of the comparison, if the reference delay amount ΔT is longer than the phase difference ΔQBI, the reference delay amount ΔT is decreased by the predetermined amount Δt at S410, and if the reference delay amount ΔT is not longer than the phase difference ΔQBI, the reference delay amount ΔT is increased by the predetermined amount Δt at S420.

When the phase difference ΔQBI between the fourth signal QB and the first signal I is compared with the reference delay amount ΔT, since the reference delay amount ΔT itself is changed instead of the delay amount ΔTI of the first signal I, a direction of a sign of the delay control signal DCODE is changed to be opposite to a sign of the delay control signal DCODE in the previous steps.

That is, when the delay amount ΔT of the second variable delay circuit 400 is changed, the direction of the sign of the delay control signal DCODE should be changed to be opposite to a previous sign of the delay control signal DCODE. To this end, the second variable delay circuit 400 further includes the inversion section 420 that inverts the 6-bit delay control signal DCODE according to bits and controls the twenty-first delay section 410 in order to allow the sign of the delay control signal DCODE to be opposite.

Then, the aforementioned steps shown in FIG. 8 are repeatedly performed, so that the delay amounts of the first variable delay circuit 100 and the second variable delay circuit 400 are continuously updated throughout the feedback-control operation.

As the feedback-control operation is repeated, the phase difference between two signals having neighboring phases, among the first signal I to the fourth signal QB, is controlled to be substantially equal to the reference delay amount $\Delta T$, and simultaneously the reference delay amount $\Delta T$ is set to a delay amount corresponding to a phase difference of 90°. Consequently, a phase difference between two signals having neighboring phases, among the first signal I to the fourth signal QB, becomes substantially equal to 90°.

The aforementioned embodiments may be easily changed in design for multiphase signals. In another embodiment, the number of delay sections included in the first variable delay circuit 100 may be changed depending on the number of multiphase signals. Thus, the number of selection signals may also be changed, and a shift steps of the register section 730 included in the filter 700 may be changed. Since a detailed description of this embodiment may be easily understood by those skilled in the art with reference to the drawings and the detailed description above, a detailed description thereof will be omitted.

The above embodiments of the present disclosure are illustrative and not limitative. Various alternatives and equivalents are possible. The present invention is not limited by the embodiments described herein. Other additions, subtractions, or modifications are obvious in view of the present disclosure and are intended to fall within the scope of the appended claims.

What is claimed is:

1. A semiconductor device comprising:
    a first variable delay circuit that delays inputted multiphase signals according to a delay control signal;
    a selection circuit that selects two signals of signals output from the first variable delay circuit;
    a second variable delay circuit that delays one of the two signals according to the delay control signal;
    a phase comparison circuit that compares a phase of a signal outputted by the second variable delay circuit to a phase of the other of the two signals;
    a filter that updates the delay control signal according to a signal outputted by the phase comparison circuit; and
    a delay control signal selection circuit that provides the delay control signal to the first variable delay circuit or the second variable delay circuit.

2. The semiconductor device according to claim 1, wherein the phase comparison circuit compares a phase difference between the two signals with a delay amount of the second variable delay circuit.

3. The semiconductor device according to claim 2, wherein the filter updates the delay control signal such that a difference between the phase difference between the two signals and the delay amount of the second variable delay circuit is reduced.

4. The semiconductor device according to claim 1, wherein the first variable delay circuit comprises:
    a plurality of delay sections that variably delay multiphase signals except for a head signal with a most advanced phase among the multiphase signals, according to the delay control signal.

5. The semiconductor device according to claim 4, wherein the selection circuit comprises:
    a first selection section that selects one of the two signals having an advanced phase as a preceding signal according to a first selection signal; and
    a second selection section that selects the other of the two signals having a delayed phase as a following signal according to a second selection signal.

6. The semiconductor device according to claim 5, wherein the preceding signal and the following signal are signals having neighboring phases among the signals output from the first variable delay circuit.

7. The semiconductor device according to claim 5, wherein, when the signal selected by the first selection section is a tail signal with a most delayed phase among the signals output from the first variable delay circuit, the second selection section selects the head signal.

8. The semiconductor device according to claim 5, wherein, when the signal selected by the first selection section is a tail signal with a most delayed phase among the signals output from the first variable delay circuit, the delay control signal selection circuit provides the delay control signal to the second variable delay circuit, and when the signal selected by the first selection section is not the tail signal, the delay control signal selection circuit provides the delay control signal to the first variable delay circuit.

9. The semiconductor device according to claim 8, wherein, when the signal selected by the first selection section is not the tail signal, the delay control signal selection circuit provides the delay control signal to a delay section of the first variable delay circuit that controls a delay amount of the signal selected by the second selection section.

10. The semiconductor device according to claim 5, further comprising:
    a first control circuit that generates the first selection signal and the second selection signal with reference to signals outputted by the first variable delay circuit.

11. The semiconductor device according to claim 10, wherein the first control circuit generates the first selection signal such that the first selection section sequentially selects the head signal to the tail signal.

12. The semiconductor device according to claim 10, wherein, when the first control circuit generates the first selection signal such that the delay control signal updated according to the signal selected by the first selection section is provided to the first variable delay circuit or the second variable delay circuit, a delay amount of the first variable delay circuit or the second variable delay circuit is changed, and other signals are selected by the first and second selection sections.

13. The semiconductor device according to claim 1, wherein the filter comprises:
    a register section that stores the delay control signal; and
    an operation section that updates the delay control signal according to a comparison result of the phase comparison circuit.

14. The semiconductor device according to claim 13, wherein the register section separately stores a first delay control signal provided to the first variable delay circuit and a second delay control signal provided to the second variable delay circuit.

15. The semiconductor device according to claim 13, wherein the register section is a shift register that operates in synchronization with a first clock signal, and the first clock signal is obtained by delaying an output signal of the second variable delay circuit by a first time.

16. The semiconductor device according to claim 15, wherein the first time corresponds to an operational time of the phase comparison circuit.

17. The semiconductor device according to claim 1, wherein the delay control signal selection circuit operates in synchronization with a second clock signal, and the second clock signal is obtained by delaying an output signal of the second variable delay circuit by a second time.

18. The semiconductor device according to claim 17, wherein the second time corresponds to operational times of the phase comparison circuit and the filter.

19. The semiconductor device according to claim 5, wherein the second variable delay circuit comprises:
 an inversion section that inverts the delay control signal; and
 a delay section that variably delays an output signal of the first selection section according to an output signal of the inversion section.

* * * * *